(12) United States Patent
Chen et al.

(10) Patent No.: US 11,257,844 B2
(45) Date of Patent: Feb. 22, 2022

(54) FERROELECTRIC RANDOM ACCESS MEMORY (FRAM) CELL

(71) Applicant: TAIWAN SEMICONDUCTOR MANUFACTURING CO., LTD., Hsinchu (TW)

(72) Inventors: Tzu-Yu Chen, Kaohsiung (TW); Sheng-Hung Shih, Hsinchu (TW); Kuo-Chi Tu, Hsinchu (TW); Wen-Ting Chu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/569,487

(22) Filed: Sep. 12, 2019

(65) Prior Publication Data

US 2021/0082928 A1  Mar. 18, 2021

(51) Int. Cl.
*H01L 27/1159* (2017.01)
*H01L 23/522* (2006.01)

(52) U.S. Cl.
CPC ...... *H01L 27/1159* (2013.01); *H01L 23/5226* (2013.01); *H01L 2924/1441* (2013.01)

(58) Field of Classification Search
CPC ............. H01L 27/1159; H01L 23/5226; H01L 2924/1441
See application file for complete search history.

(56) References Cited

U.S. PATENT DOCUMENTS

| | | | |
|---|---|---|---|
| 6,376,325 B1* | 4/2002 | Koo | H01L 28/75 257/E21.009 |
| 2002/0004248 A1* | 1/2002 | Lee | H01L 28/55 438/3 |
| 2002/0021544 A1* | 2/2002 | Cho | H01L 27/11502 361/200 |
| 2004/0191930 A1* | 9/2004 | Son | H01L 28/55 438/3 |
| 2007/0057300 A1* | 3/2007 | Fukada | H01L 27/11502 257/295 |
| 2015/0072441 A1* | 3/2015 | Sun | H01L 27/11507 438/3 |

* cited by examiner

*Primary Examiner* — Kyoung Lee
*Assistant Examiner* — Christina A Sylvia
(74) *Attorney, Agent, or Firm* — Maschoff Brennan

(57) ABSTRACT

A semiconductor device includes a lower intermetal dielectric (IMD) layer, a middle conductive line, and a ferroelectric random access memory (FRAM) structure. The middle conductive line is embedded in the lower IMD layer. The FRAM structure is over the lower IMD layer and the middle conductive line. The FRAM structure includes a bottom electrode, a ferroelectric layer, and a top electrode. The bottom electrode is over the middle conductive line and in contact with the lower IMD layer. The ferroelectric layer is over the bottom electrode. The top electrode is over the ferroelectric layer.

20 Claims, 18 Drawing Sheets

FERROELECTRIC RANDOM ACCESS MEMORY (FRAM) CELL

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
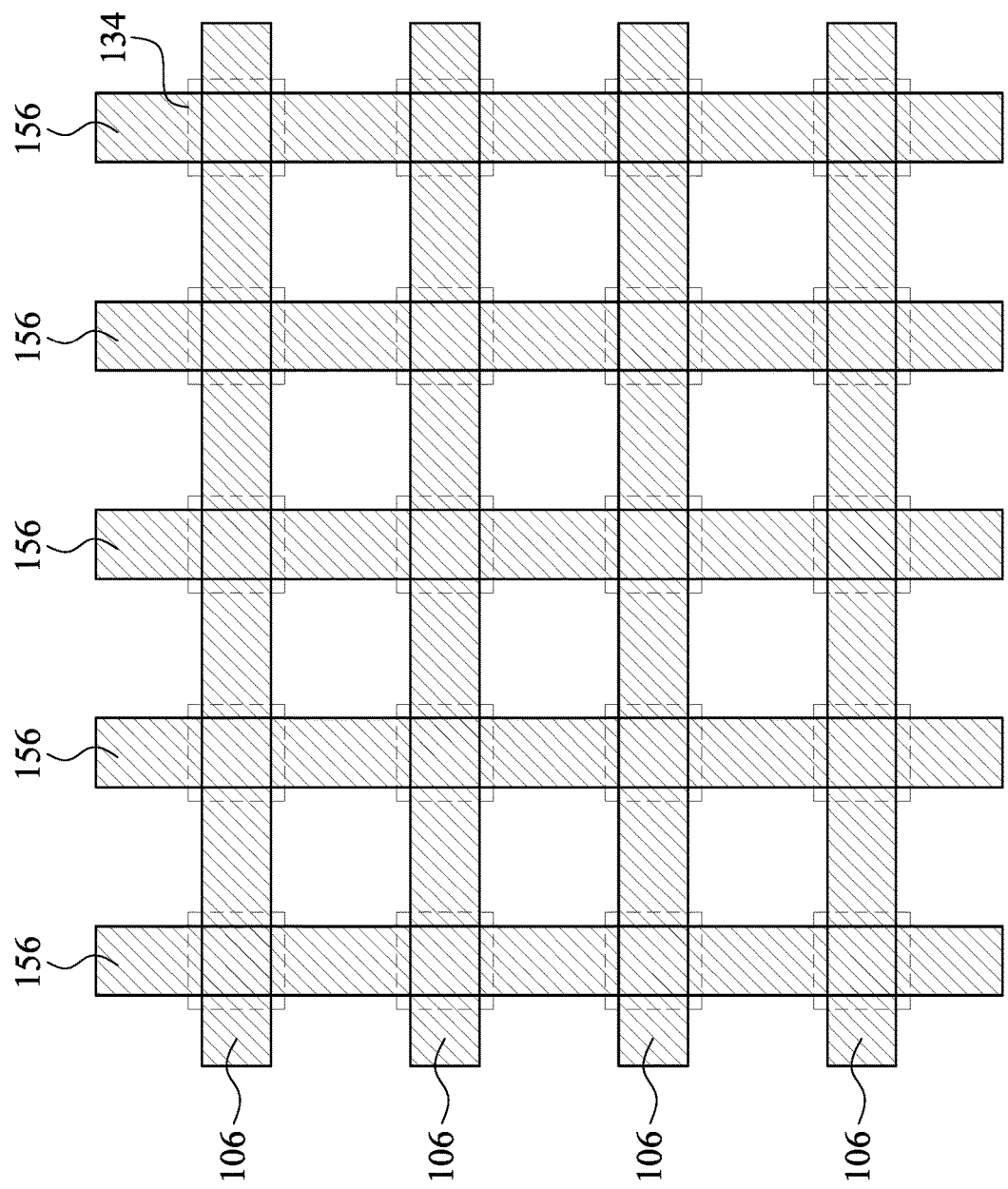
FIG. 1A is a ferroelectric random access memory (FRAM) cell layout according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in contact, and may also include embodiments in which additional features may be formed between the first and second features, such that the first and second features may not be in contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Figure 1B:
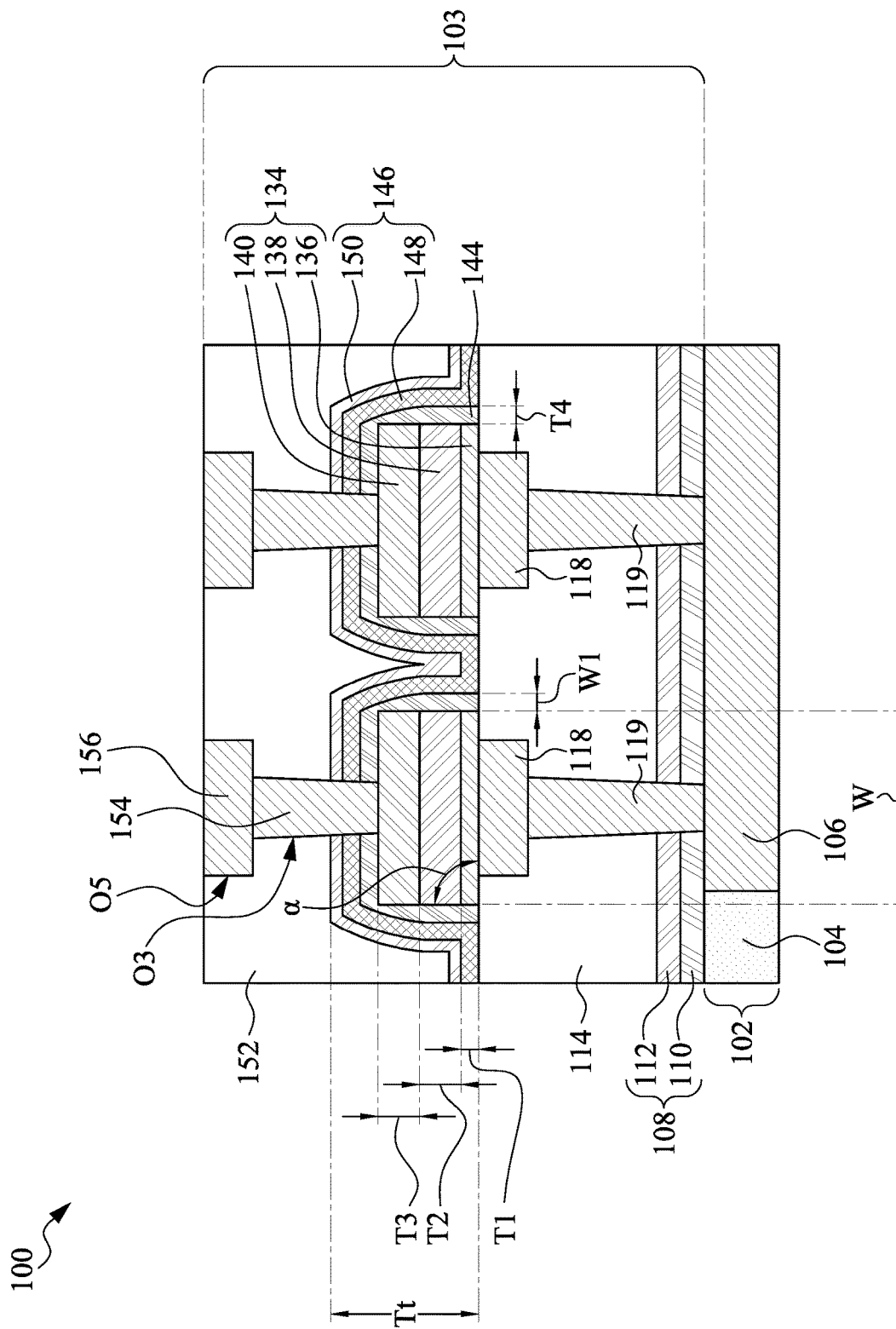
FIG. 1B shows a cross-sectional view of a semiconductor device using the FRAM cell layout in FIG. 1A.

FIG. 1A is a ferroelectric random access memory (FRAM) cell layout according to some embodiments of the present disclosure. FIG. 1B shows a cross-sectional view of a semiconductor device 100 using the FRAM cell layout in FIG. 1A. Referring to FIGS. 1A and 1B, the semiconductor device 100 includes a substrate 102 and an interconnect structure 103. The interconnect structure 103 is built over the substrate 102 and connects various active and/or passive devices in the substrate 102 to form an IC. For the purpose of simplicity, the interconnect structure 103 is shown to have two layers of conductive lines in FIG. 1A. For example, a bottom layer includes bottom conductive lines 106, and a top layer includes top conductive lines 156. The interconnect structure 103 further includes a middle layer. The middle layer includes middle conductive lines 118. The bottom layer and the middle layer are interconnected through bottom conductive vias 119. The top layer and the middle layer are interconnected through top electrode vias 154. It is noted that, in various embodiments, the interconnect structure 103 may include more than three layers of conductive lines, such as five, seven, or even more layers in complex ICs. In addition, the interconnect structure 103 may include one or more layers of conductive lines below the bottom conductive lines 106 and/or above the top conductive lines 156.

In the embodiments as shown, the interconnect structure 103 includes a dielectric layer 104, an upper intermetal dielectric (IMD) layer 152 and a lower intermetal dielectric (IMD) layer 114, which both include an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). The interconnect structure 103 includes a barrier layer 108 in a form of a stacking layer including a lower etch stop layer 110 and a lower protective liner layer 112. The lower etch stop layer 110 is over the dielectric layer 104 and the bottom conductive lines 106. The lower protective liner layer 112 is over the lower etch stop layer 110.

Figure 17:
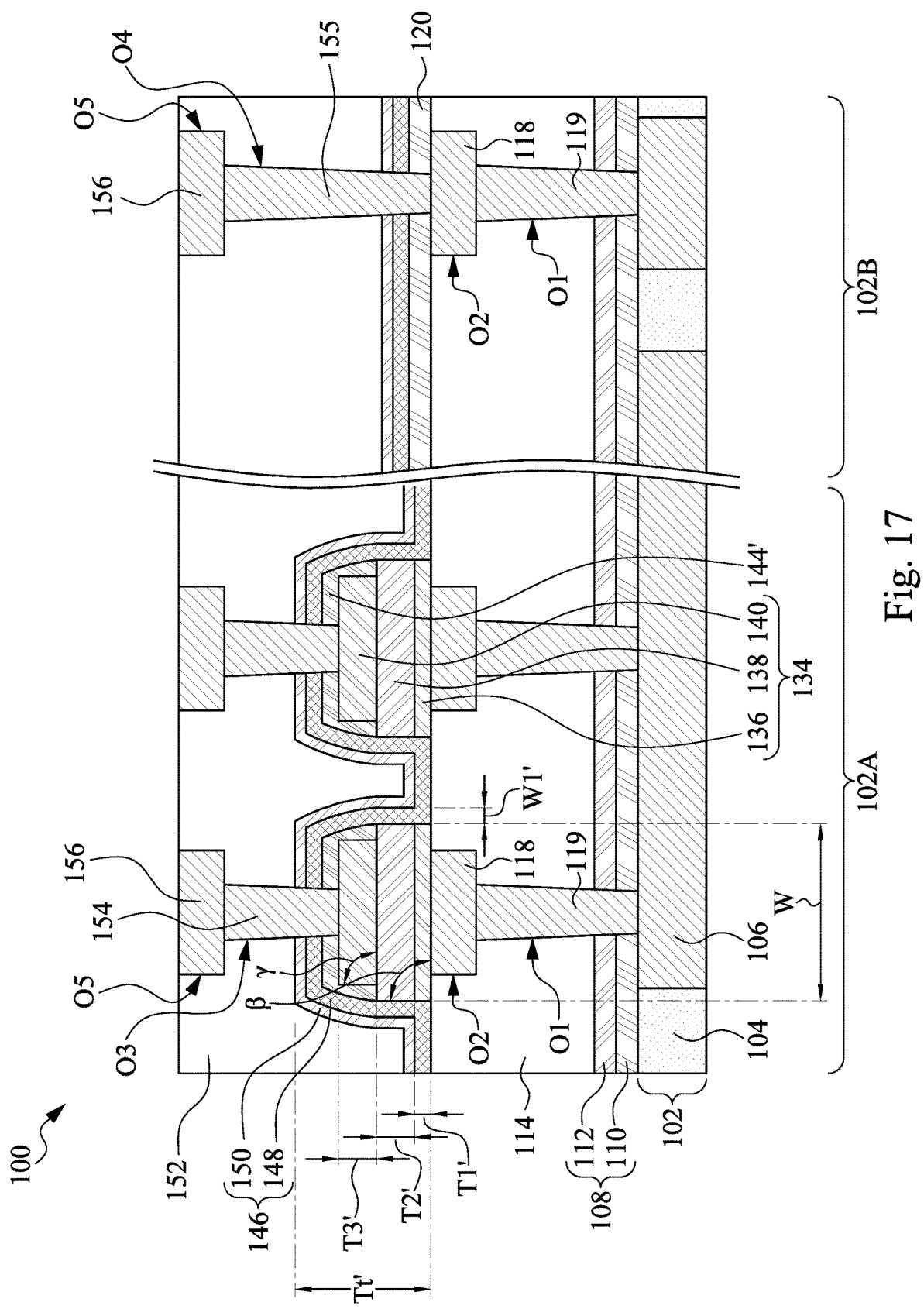

The interconnect structure 103 includes FRAM structures 134 and spacers 144. The FRAM structure 134 includes a bottom electrode 136, a ferroelectric layer 138 and a top electrode 140. The spacer 144 surrounds the top electrode 140, the ferroelectric layer 138, and the bottom electrode 136 of the FRAM structure 134. The FRAM structure 134 is formed at intersections of the bottom conductive lines 106 and the top conductive lines 156 (see FIG. 1A). In particular, the FRAM structure 134 is formed over the lower IMD layer 114 and the middle conductive line 118. The interconnect structure 103 further includes a barrier layer 146 in a form of a stacking layer including a top etch stop layer 148 and an upper protective liner layer 150. The top etch stop layer 148 is formed over the lower IMD layer 114 and the spacer 144, and has a conformal cross-sectional profile in the present embodiment. The top etch stop layer 148 is over the FRAM structure 134. The upper protective liner layer 150 is formed over the top etch stop layer 148. The bottom conductive via 119 is embedded in the lower IMD layer 114, the lower protective liner layer 112, and the lower etch stop layer 110. The middle conductive line 118 is over the bottom conductive via 119 and is embedded in the lower IMD layer 114. The top conductive line 156 electrically connects to the top electrode 140 of the FRAM structure 134 through the top electrode via 154. The spacer 144 is on sidewalls and on a top of the FRAM structure 134. In particular, the spacer 144 extends along a top surface and sidewalls of the top electrode 140, sidewalls of ferroelectric layer 138, and sidewalls of the bottom electrode 136 and terminates at a top surface of the lower IMD layer 114. In alternative embodiments, the spacer 144' extends along the top surface and the sidewalls of the top electrode 140 and terminates at a top surface of the ferroelectric layer 138, as shown in FIG. 17. An interface between the spacer 144 and the lower IMD layer 114 is coplanar with the interface between the top etch stop layer 148 and the lower IMD layer 114.

In various embodiments, the upper protective liner layer 150 and the lower protective liner layer 112 include a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The top etch stop layer 148, the upper etch stop layer 120 and the lower etch stop layer 110 include a dielectric material that has a higher density than densities of the materials in the dielectric layer 104 and the lower and upper protective liner layers 112, 150. For example, the etch stop layer may include material selected from the group consisting of SiCN, SiCO, $SiO_2$, SiN, SiC and AlON, or other suitable materials. In some embodiments, a material of the lower IMD layer 114 is different from a material of the top etch stop layer 148 and an interface exists therebetween.

In some embodiments, the bottom electrode 136 of the FRAM structure 134 has a flat bottom surface in contact with the middle conductive line 118 and the lower IMD layer 114. An interface between the bottom electrode 136 of the FRAM structure 134 and the lower IMD layer 114 is coplanar with an interface between the bottom electrode 136 of the FRAM structure 134 and the middle conductive line 118. An interface between the top etch stop layer 148 and the lower IMD layer 114 is also coplanar with a top surface of the middle conductive line 118. Accordingly, there is no gap between the FRAM structure 134 and the lower IMD layer 114. In other words, a step height is absent between the FRAM structure 134 and the lower IMD layer 114, which results in an improved uniformity for a surface topography of the top electrode via 154 and the top conductive line 156.

The upper IMD layer 152 is formed over the upper protective liner layer 150 and fills a gap between two neighboring FRAM structures 134. The top electrode 140, the ferroelectric layer 138, and the bottom electrode 136 have substantially the same width. In some embodiments, a width W of the FRAM structure 134 is in a range from about 50 nm to about 150 nm. A thickness Tt of a combination of the upper protective liner layer 150, the top etch stop layer 148, the spacer 144, and the FRAM structure 134 is in a range from about 400 nm to about 800 nm. For example, in some embodiments, a thickness T1 of the bottom electrode 136 is greater than about 5 nm. In some embodiments, a thickness T2 of the ferroelectric layer 138 is greater than about 2 nm. In some embodiments, a thickness T3 of the top electrode 140 is greater than about 5 nm. In some embodiments, a width W1 of the spacer 144 is in a range from about 0.5 nm to about 50 nm. If the thickness Tt of the combination of the upper protective liner layer 150, the top etch stop layer 148, the spacer 144, and the FRAM structure 134, the width W of the FRAM structure 134, and the width W1 of the spacer 144 are not in the ranges as mentioned above, an aspect ratio of a combination of the FRAM structure 134, the upper protective liner layer 150, the top etch stop layer 148, and the spacer 144 may not be sufficient to allow the upper IMD layer 152 over the upper protective liner layer 150 to fill into the gap between two neighboring FRAM structures 134. In particular, the FRAM structure 134 has opposite sidewalls that extend at an angle α in a range from about 45 degrees to about 90 degrees from its bottom surface (e.g., a bottom surface of the bottom electrode 136) in order to ensure that the two neighboring FRAM structures 134 laterally spaced apart to prevent shorting.

Figure 2:
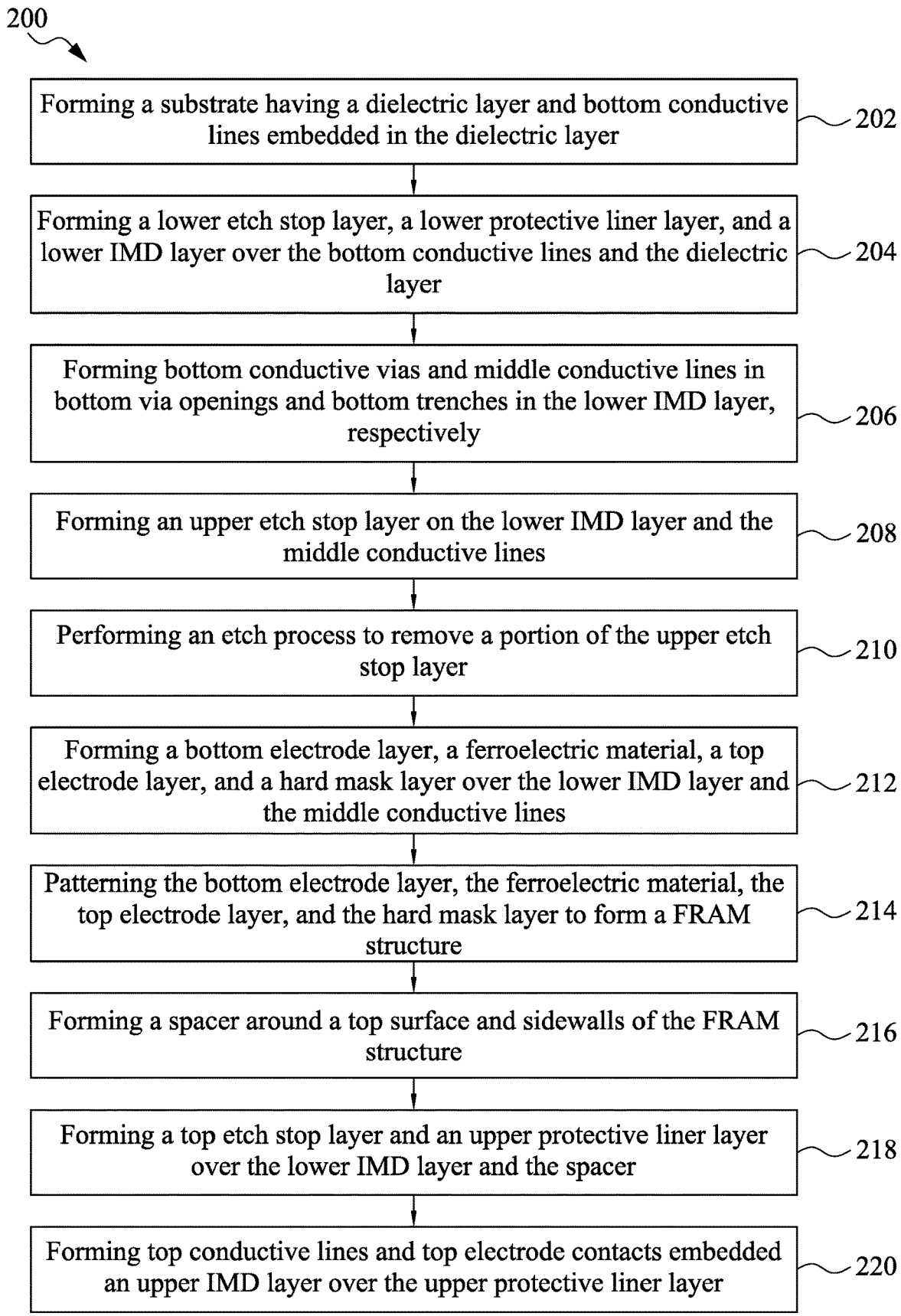
FIG. 2 is a flow chart of a method of forming a semiconductor device according to various aspects of the present disclosure.
Figure 3:
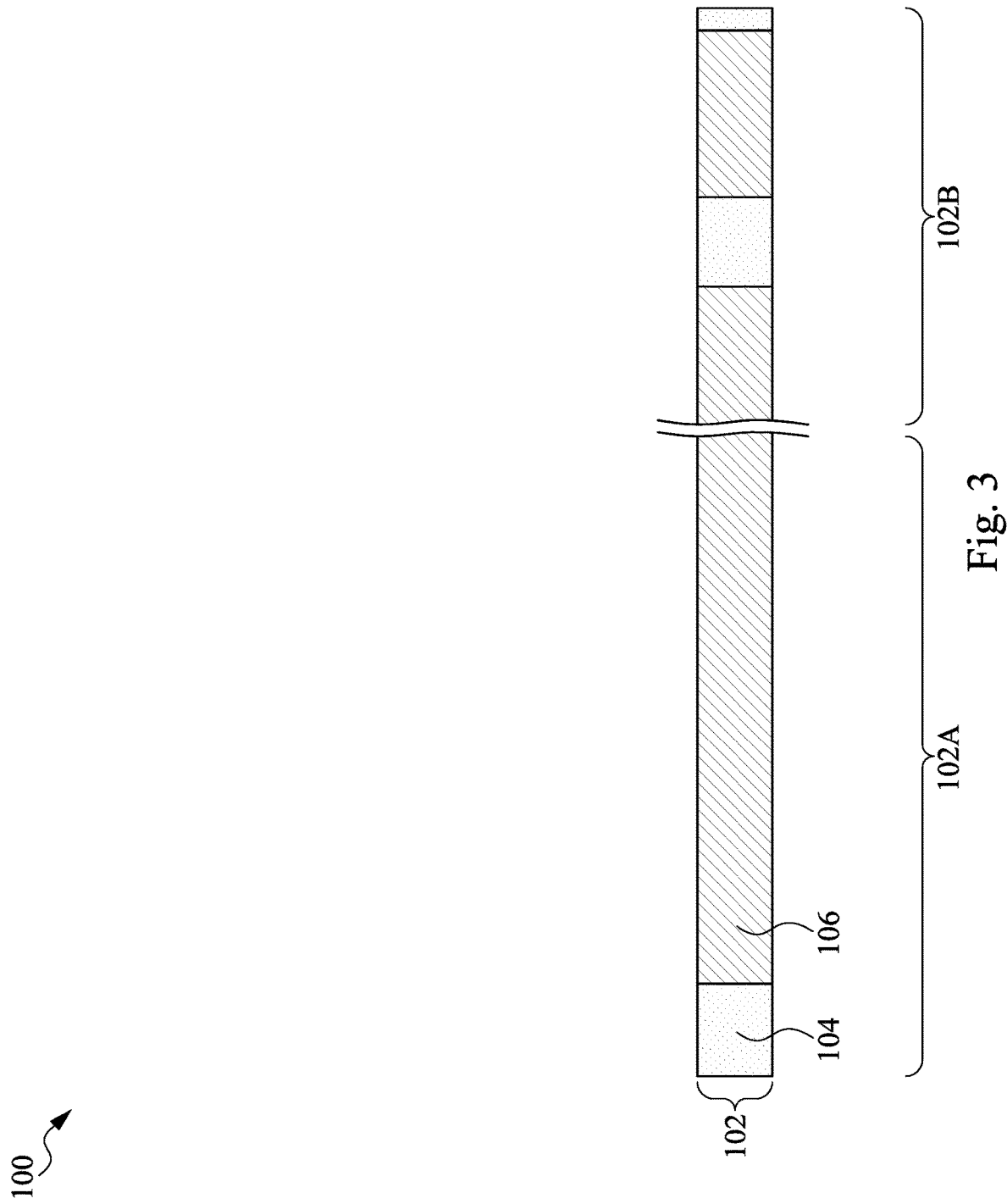
FIGS. 3-12 are cross-sectional views of a method of forming a semiconductor device at various stages in accordance with various embodiments of the present disclosure.

FIG. 2 is a flow chart of a method 200 of forming the semiconductor device according to various aspects of the present disclosure. The method 200 is merely an example, and is not intended to limit the present disclosure beyond what is explicitly recited in the claims. Additional operations can be replaced, eliminated, or moved around for additional embodiments of the method. Various operations of the method 200 are discussed in association with cross-sectional views in FIGS. 3-12. The method 200 begins at operation 202 where a substrate having a dielectric layer (e.g., an inter-layer dielectric (ILD) layer or an intermetal dielectric (IMD) layer) and bottom conductive lines embedded in the dielectric layer is formed. With reference to FIG. 3, in some embodiments of operation 202, a substrate 102 having a dielectric layer 104 and bottom conductive lines 106 embedded in the dielectric layer 104 is formed. The substrate 102 includes a FRAM portion 102A and a logic device portion 102B. The FRAM portion 102A can correspond to an array of memory cells (e.g., memory cell) while the logic device portion 102B can couple logic devices, such as transistors formed in the substrate 102, to support operation of the memory cells.

In some embodiments, the bottom conductive lines 106 are formed by forming a conductive material layer (not shown) over the dielectric layer 104 over the FRAM portion 102A and filling in a via opening (not shown) exposing the one of the source/drain regions of a transistor (not shown) by suitable processes such as plating, chemical vapor deposition (CVD), physical vapor deposition (PVD) and/or the like, and then removing the conductive material layer outside the dielectric layer 104 by suitable processes such as chemical mechanical polishing (CMP), etching and/or the like.

In some embodiments, the substrate 102 includes a silicon substrate (e.g., a wafer). Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 102 may further include passive devices such as resistors, capacitors, and inductors.

Figure 4:
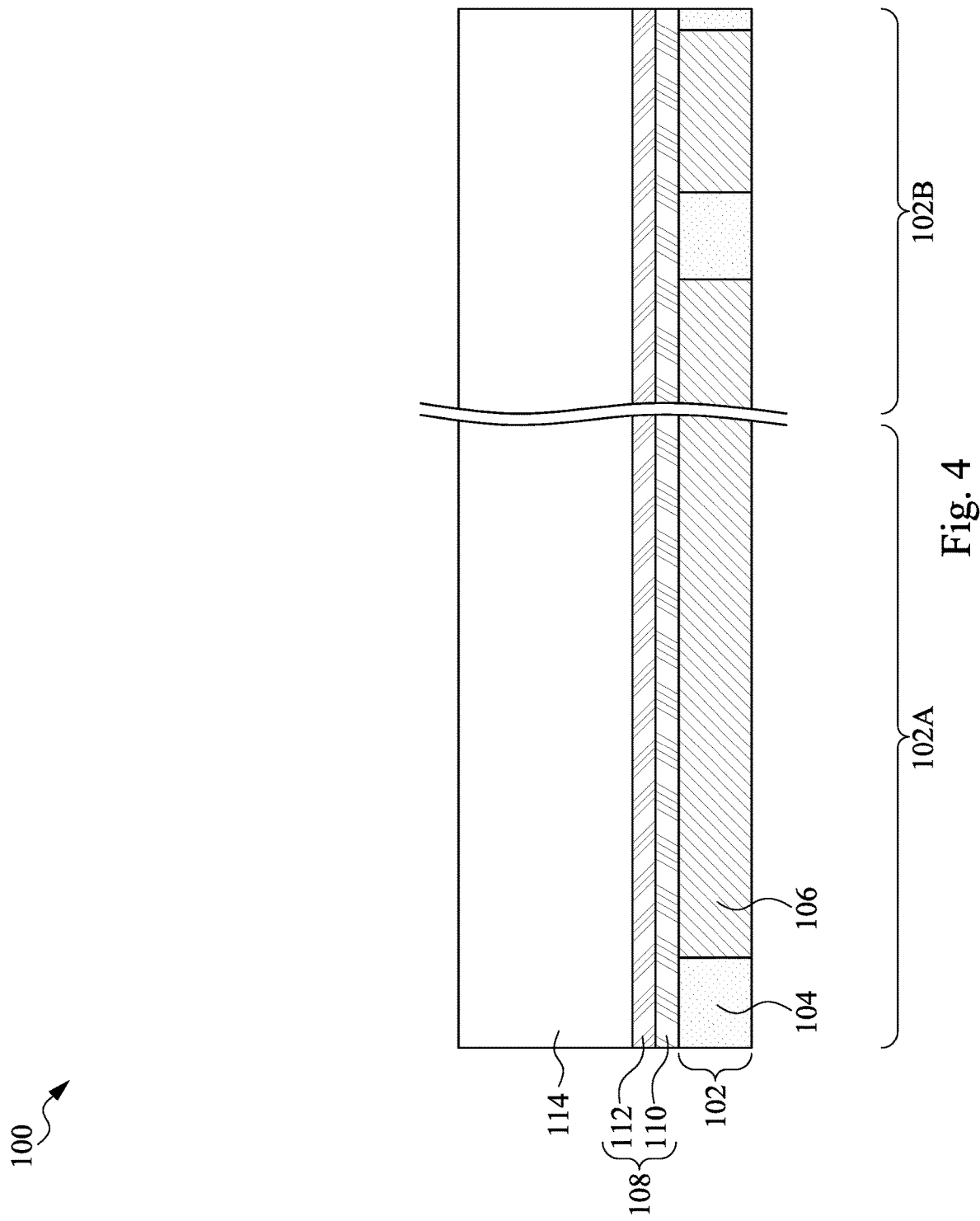

Returning to FIG. 2, the method 200 then proceeds to operation 204 where a lower etch stop layer, a lower protective liner layer, and a lower IMD layer are formed over the bottom conductive lines and the dielectric layer. With reference to FIG. 4, in some embodiments of operation 204, a barrier layer 108 in a form of a stacking layer including a lower etch stop layer 110 and a lower protective liner layer 112 is blanket deposited over top surfaces of the bottom conductive lines 106 and a top surface of the dielectric layer 104, over both the FRAM portion 102A and the logic device portion 102B. The barrier layer 108 may be formed by a variety of techniques, e.g., chemical vapor deposition (CVD), low-pressure CVD (LPCVD), plasma-enhanced CVD (PECVD), sputtering and physical vapor deposition (PVD), thermal growing, and the like. A lower IMD layer 114 is then disposed over the substrate 102. The lower IMD layer 114 may be formed using chemical vapor deposition (CVD) such as LPCVD, PECVD, and flowable CVD (FCVD). The top surface of the lower IMD layer 114 is planarized.

Figure 5:
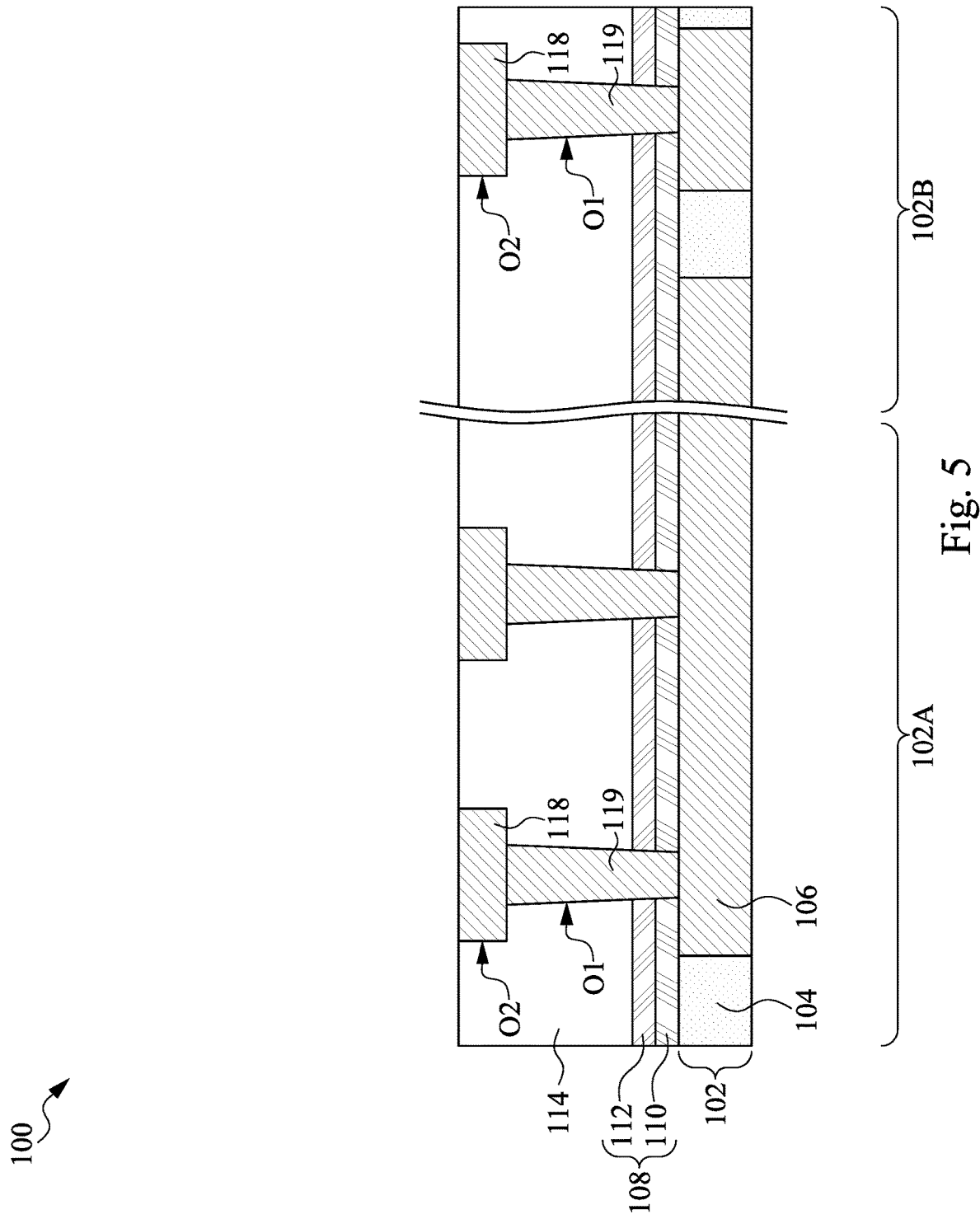

Returning to FIG. 2, the method 200 then proceeds to operation 206 where bottom conductive vias and middle conductive lines are formed in bottom via openings and bottom trenches in the lower IMD layer, respectively. With reference to FIG. 5, in some embodiments of operation 206, a mask layer (not shown) is formed and patterned over the lower IMD layer 114. An etching process is performed to form bottom via openings O1 through the lower IMD layer 114, the lower protective liner layer 112, and the lower etch stop layer 110 and reaching onto the bottom conductive lines 106, and form bottom trenches O2 in the lower IMD layer 114 above the bottom via openings O1. The mask layer can be a photoresist layer having openings corresponding to the bottom trenches O2 and the bottom via openings O1 to be formed. In some embodiments, the bottom via openings O1 and the bottom trenches O2 can be formed through a dry etch process such as a plasma etching. The bottom via openings O1 are formed to reach on the bottom conductive lines 106 over the FRAM portion 102A and the logic device portion 102B. A metal material (e.g., copper, aluminum, etc) is filled in the bottom via openings O1 the bottom trenches O2 to form bottom conductive vias 119 and middle conductive lines 118, respectively, by suitable processes such as plating, chemical vapor deposition (CVD), physical vapor deposition (PVD) and/or the like, and then removing the conductive material layer outside the dielectric layer 104 by suitable processes such as CMP, etching and/or the like.

Figure 6:
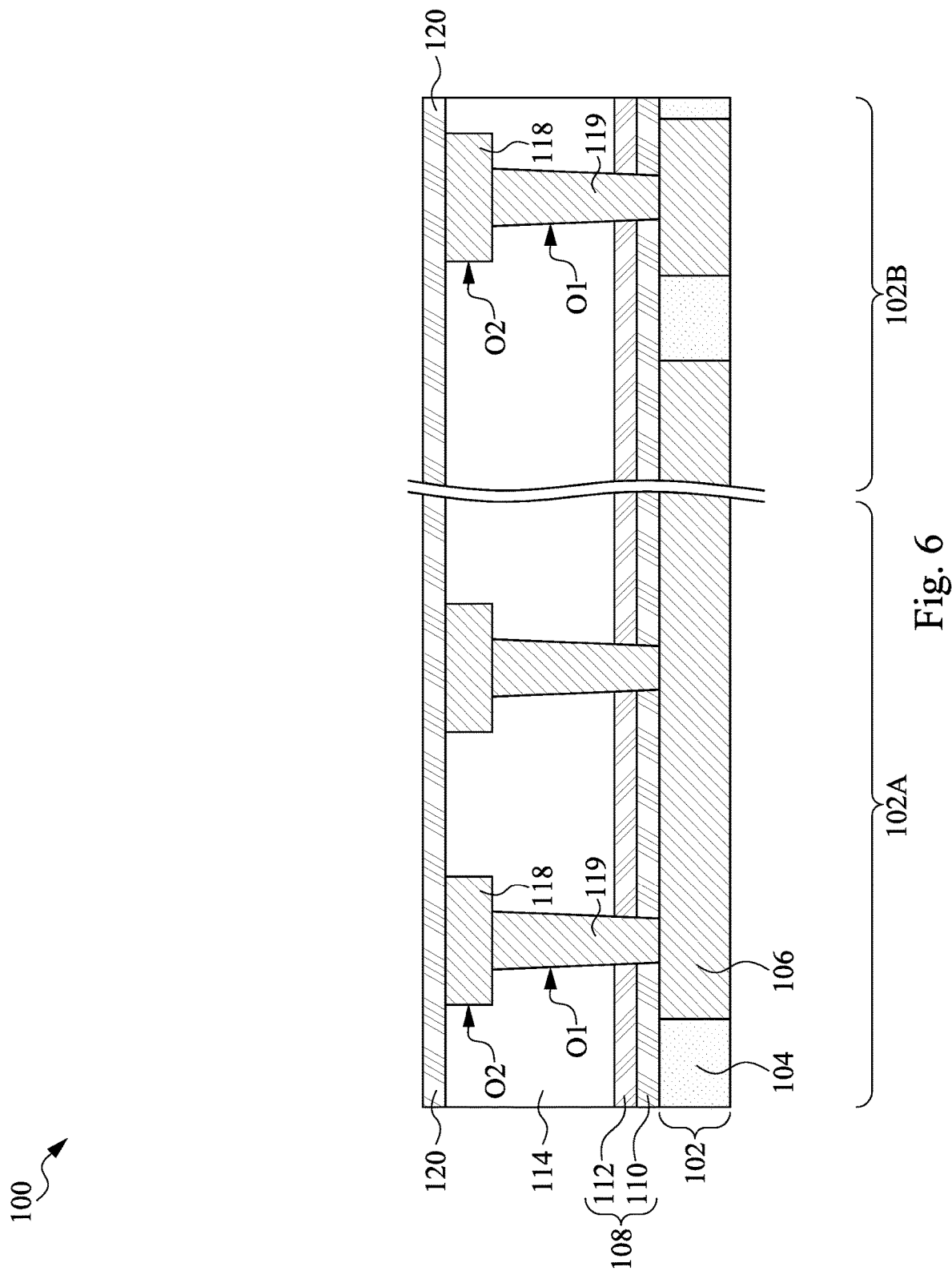

Returning to FIG. 2, the method 200 then proceeds to operation 208 where an upper etch stop layer is formed on the lower IMD layer and the middle conductive lines. With reference to FIG. 6, in some embodiments of operation 208, an upper etch stop layer 120 is blanket formed over the lower IMD layer 114 and the middle conductive lines 118 embedded in the lower IMD layer 114 for both the logic device portion 102B and the FRAM portion 102A. The upper etch stop layer 120 may be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 7:
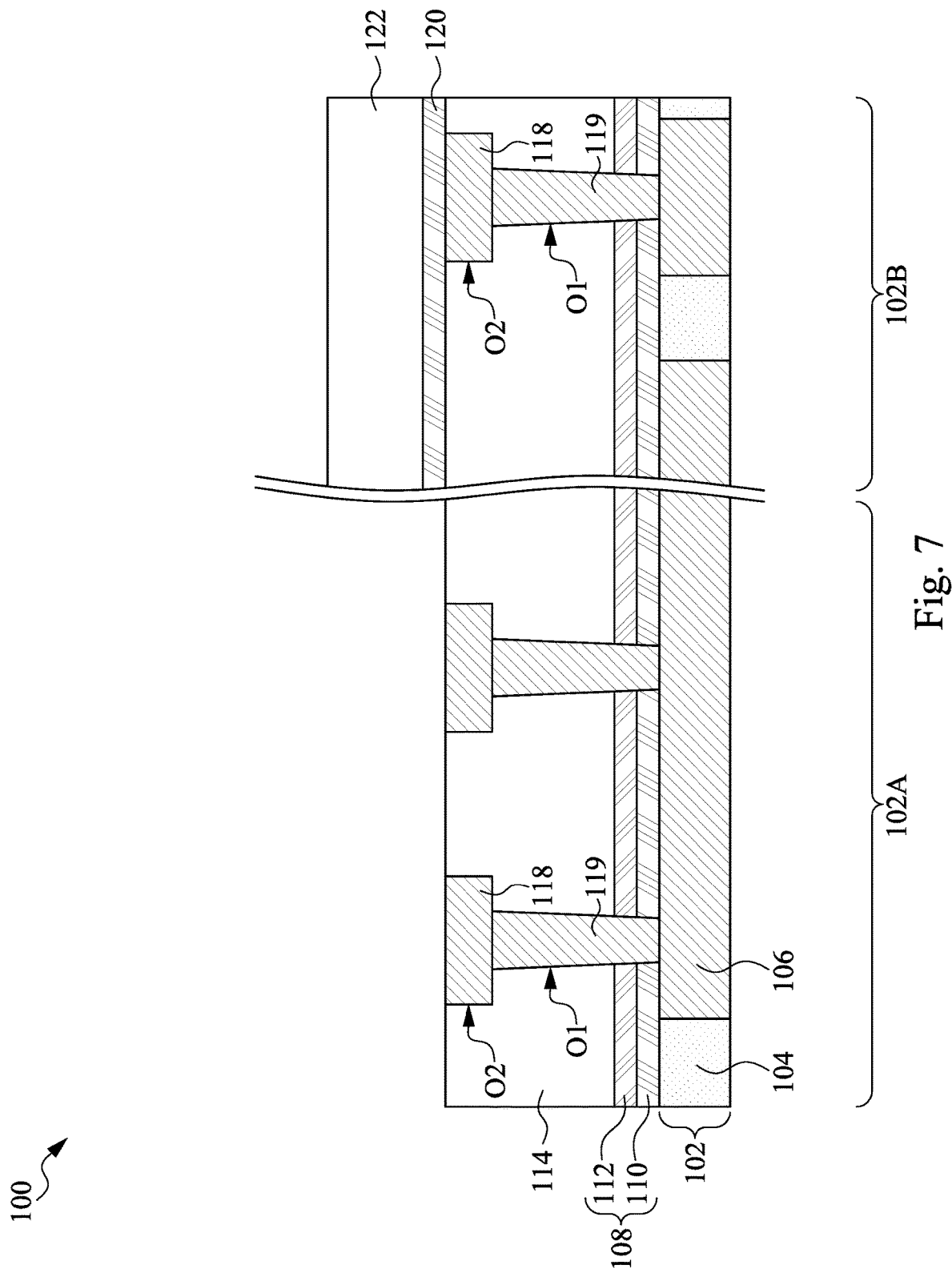

Returning to FIG. 2, the method 200 then proceeds to operation 210 where an etch process is performed to remove a portion of the upper etch stop layer. With reference to FIG. 7, in some embodiments of operation 210, an etch process is carried out with a mask 122 in place to selectively remove a portion of the upper etch stop layer 120 over the FRAM portion 102A. Therefore, a portion of the middle conductive lines 118 and a portion of the lower IMD layer 114 are exposed over the FRAM portion 102A. In other words, the FRAM portion 102A is free from coverage by the upper etch stop layer 120.

Figure 8:
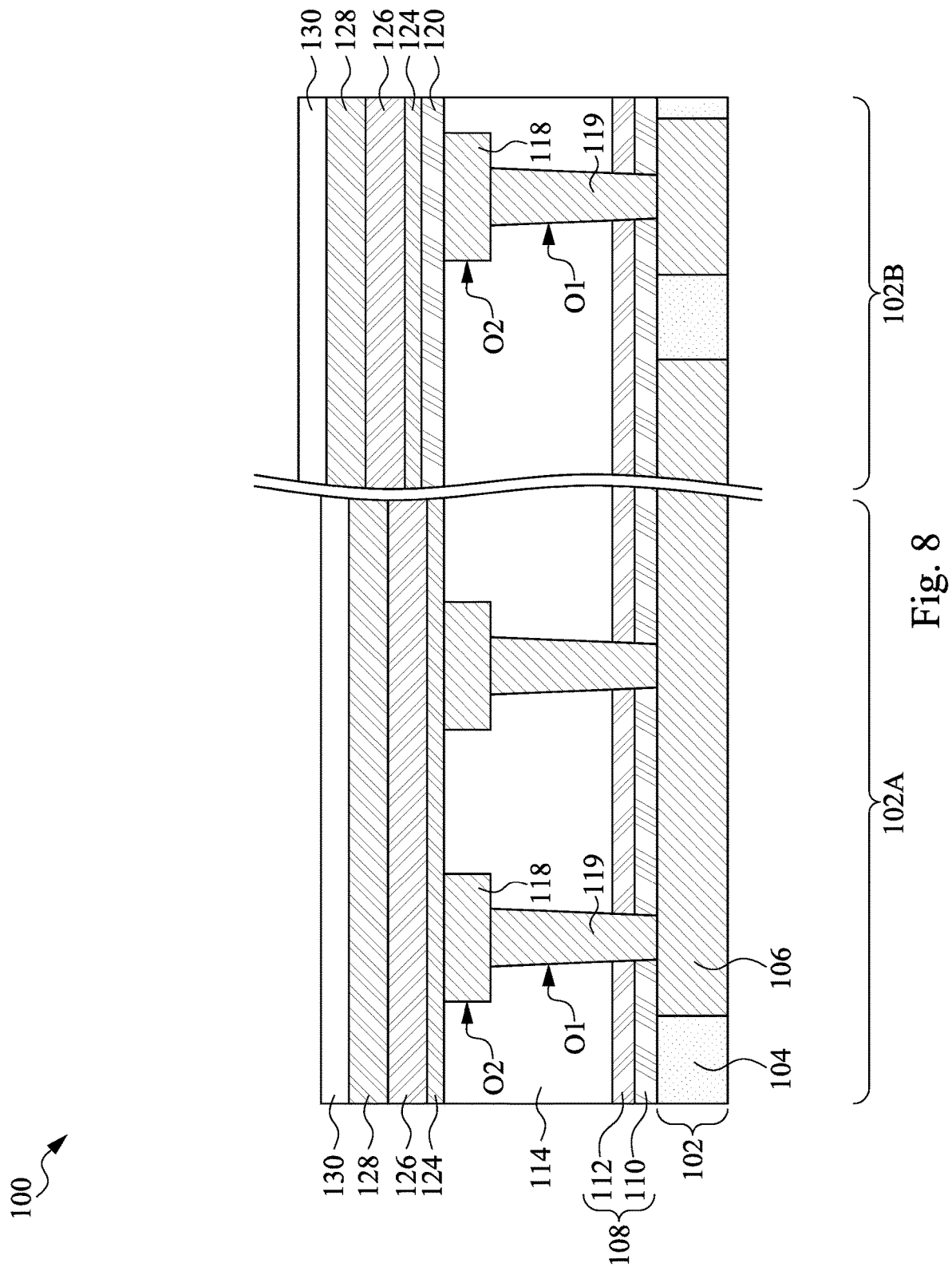

Returning to FIG. 2, the method 200 then proceeds to operation 212 where a bottom electrode layer, a ferroelectric material, a top electrode layer, and a hard mask layer are formed over the lower IMD layer and the middle conductive lines. With reference to FIG. 8, in some embodiments of operation 212, a bottom electrode layer 124, a ferroelectric material 126, and a top electrode layer 128 are deposited in sequence over the lower IMD layer 114 and the middle conductive lines 118 embedded in the lower IMD layer 114 over the FRAM portion 102A. Moreover, the bottom electrode layer 124, the ferroelectric material 126, and the top electrode layer 128 are deposited in sequence over the upper etch stop layer 120 in the logic device portion 102B. The bottom electrode layer 124 may be formed by suitable processes such as plating, chemical vapor deposition (CVD), physical vapor deposition (PVD) and/or the like. Thereafter, the ferroelectric material 126 and the top electrode layer 128 are conformally formed over the bottom electrode layer 124 in sequence. The ferroelectric material 126 includes ferroelectric materials, for example, strontium bismuth tantalite (SBT), lead zirconate titanate (PZT), hafnium zirconium oxide (HZO), doped hafnium oxide (Si:HfO$_2$), the like, or combinations thereof. The ferroelectric material 126 may be formed by chemical vapor deposition (CVD), such as high density plasma CVD (HDPCVD), plasma enhanced CVD (PECVD), atomic layer deposition (ALD), plasma enhanced ALD (PEALD), combinations thereof, and other suitable techniques. A hard mask layer 130 is subsequently formed on the top electrode layer 128 over the FRAM portion 102A and the logic device portion 102B to facilitate the patterning of the FRAM structure 134 (see FIG. 9).

Figure 9:
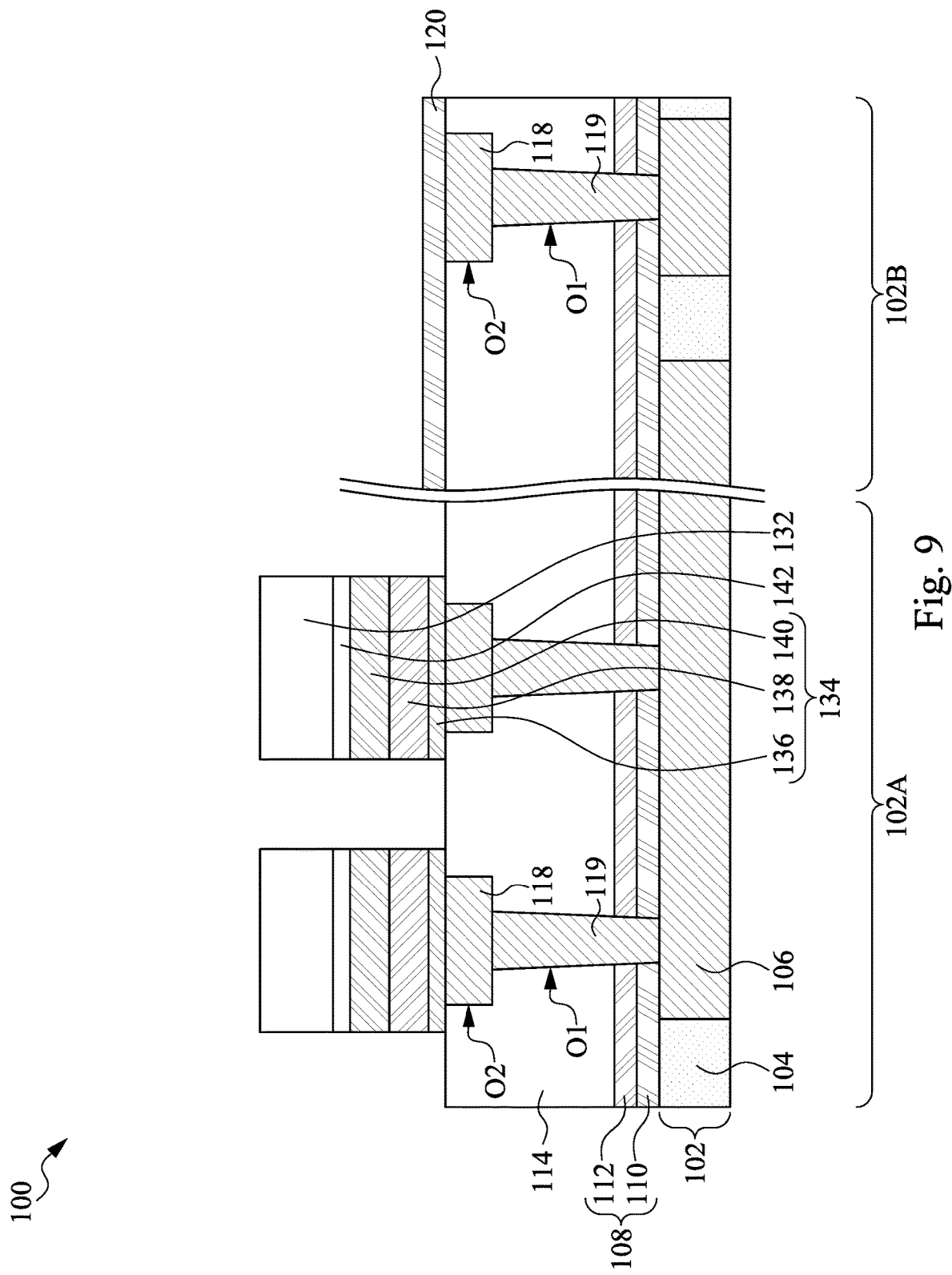

Returning to FIG. 2, the method 200 then proceeds to operation 214 where the bottom electrode layer, the ferroelectric material, the top electrode layer, and the hard mask layer are patterned to form a FRAM structure. With reference to FIG. 9, in some embodiments of operation 214, a patterned photoresist 132 is spin-on coated on the hard mask layer 130 and defines the FRAM structure 134. In detail, the bottom electrode layer 124, the ferroelectric material 126, the top electrode layer 128, and the hard mask layer 130 are patterned to form a bottom electrode 136, a ferroelectric layer 138, a top electrode 140, and a patterned hard mask 142, respectively. The patterning includes a photolithography operation where a photoresist is deposited, a pattern in defined by exposing photoresist to a radiation, and developing the photoresist to create a patterned photoresist 132. The patterned photoresist 132 is then used as an etch mask to protect desired portions of the FRAM structure 134. Portions of the hard mask layer 130, the top electrode layer 128, the ferroelectric material 126, and the bottom electrode layer 124 are removed from the FRAM portion 102A. All of the hard mask layer 130, the top electrode layer 128, the ferroelectric material 126, and the bottom electrode layer 124 are removed from the logic device portion 102B. The patterned hard mask 142, the top electrode 140, the ferroelectric layer 138, and the bottom electrode 136 have a substantially same width remain over lower IMD layer 114 due to the patterned photoresist 132. In some embodiments, a material of the bottom electrode 136 of the FRAM structure 134 is different from a material of the middle conductive line 118 and an interface exists therebetween. For example, the top electrode 140 and the bottom electrode 136 may include tantalum nitride, titanium nitride, tungsten, ruthenium, iridium, the like, or combinations thereof. In some other embodiments, the material of the bottom electrode 136 of the FRAM structure 134 is the same as the material of the middle conductive line 118. For example, the middle conductive line 118 and the bottom electrode 136 include tantalum nitride, titanium nitride, tungsten, ruthenium, iridium, copper, aluminum, the like, or combinations thereof.

The FRAM structure 134 is electrically connected to the bottom conductive line 106 through the middle conductive line 118 and the bottom conductive via 119 which are embedded in the lower IMD layer 114. In other words, the middle conductive line 118 and the bottom conductive via 119 in combination function as a bottom via/electrode of the FRAM structure 134. No additional mask is required to satisfy a requirement of bottom via/electrode for the FRAM structure 134 and thus saving cost and fabrication time. The bottom electrode layer 124, the ferroelectric material 126, the top electrode layer 128, and the hard mask layer 130 are etched with an etch process having an etch selectivity for the bottom electrode layer 124 being greater than an etch selectivity of the lower IMD layer 114.

Figure 10:
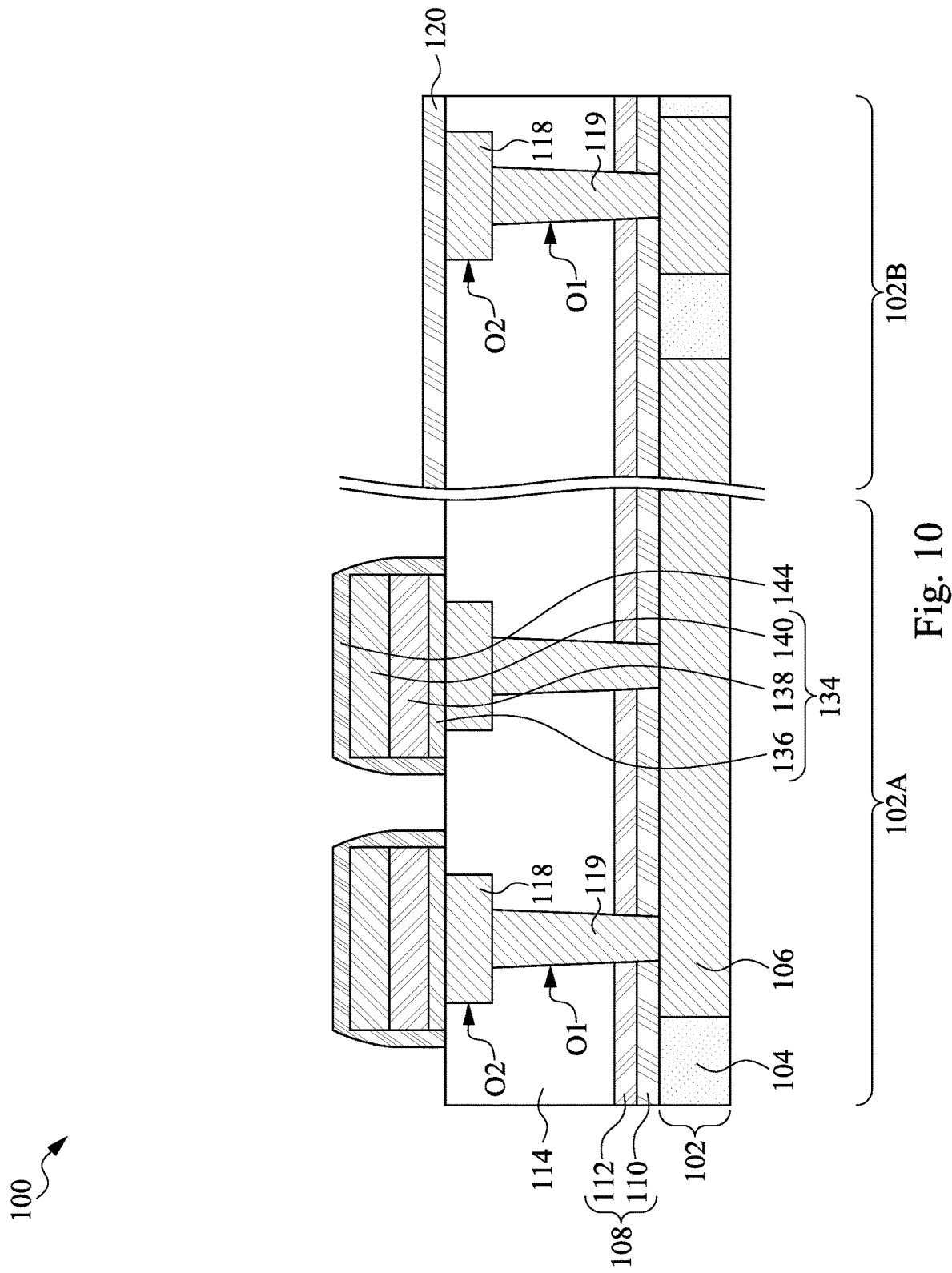

Returning to FIG. 2, the method 200 then proceeds to operation 216 where a spacer is formed around a top surface and sidewalls of the FRAM structure. With reference to FIG. 10, in some embodiments of operation 216, in one example, an etching process includes applying a dry (or plasma) etch is performed to remove the patterned hard mask 142. A spacer material is deposited to cover the top electrode 140, the ferroelectric layer 138, the bottom electrode 136, and the lower IMD layer 114 over the FRAM portion 102A and cover the upper etch stop layer 120 in the logic device portion 102B. The spacer material is then anisotropically etched to form a spacer 144 covering a top surface of the top electrode 140 and on sidewalls of the top electrode 140, the ferroelectric layer 138, and the bottom electrode 136.

Figure 11:
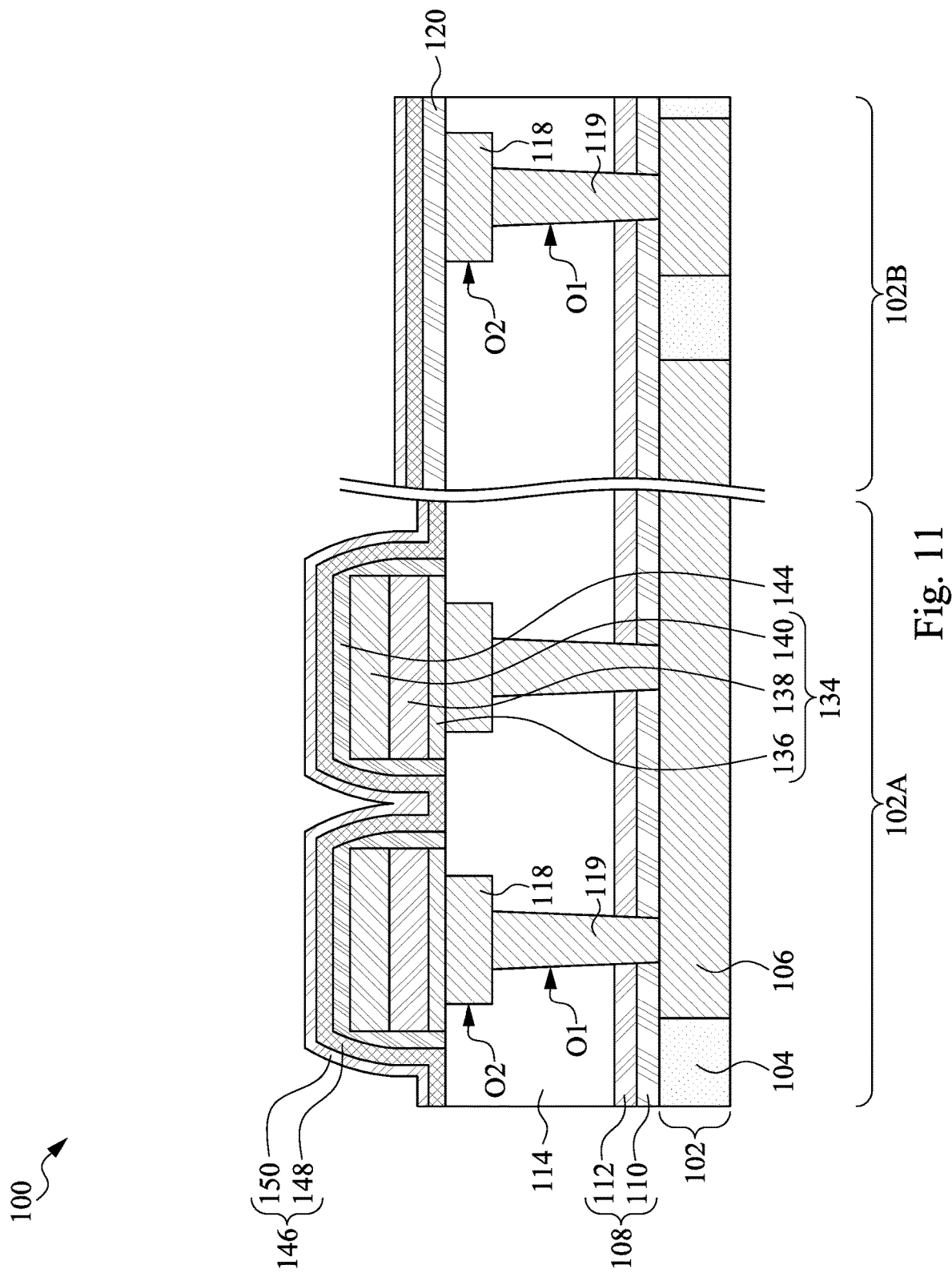

Returning to FIG. 2, the method 200 then proceeds to operation 218 where a top etch stop layer and an upper protective liner layer are formed over the lower IMD layer and the spacer. With reference to FIG. 11, in some embodiments of operation 218, a barrier layer 146 in a form of a stacking layer including a top etch stop layer 148 and an upper protective liner layer 150 is blanket deposited over the lower IMD layer 114 and the spacer 144 over the FRAM portion 102A and over the upper etch stop layer 120 in the logic device portion 102B. The upper etch stop layer 120 has a bottom surface substantially coplanar with a bottommost surface of the top etch stop layer 148. The top etch stop layer 148 has a first portion and a second portion respectively over the FRAM portion 102A and the logic device portion 102B. The first portion has a bottommost surface lower than a bottom surface of the second portion due to the upper etch stop layer 120 over the logic device portion 102B. The upper protective liner layer 150 over the logic device portion 102B has a bottom surface higher than a bottommost surface of the upper protective liner layer 150 over the FRAM portion 102A. The barrier layer 146 may be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 12:
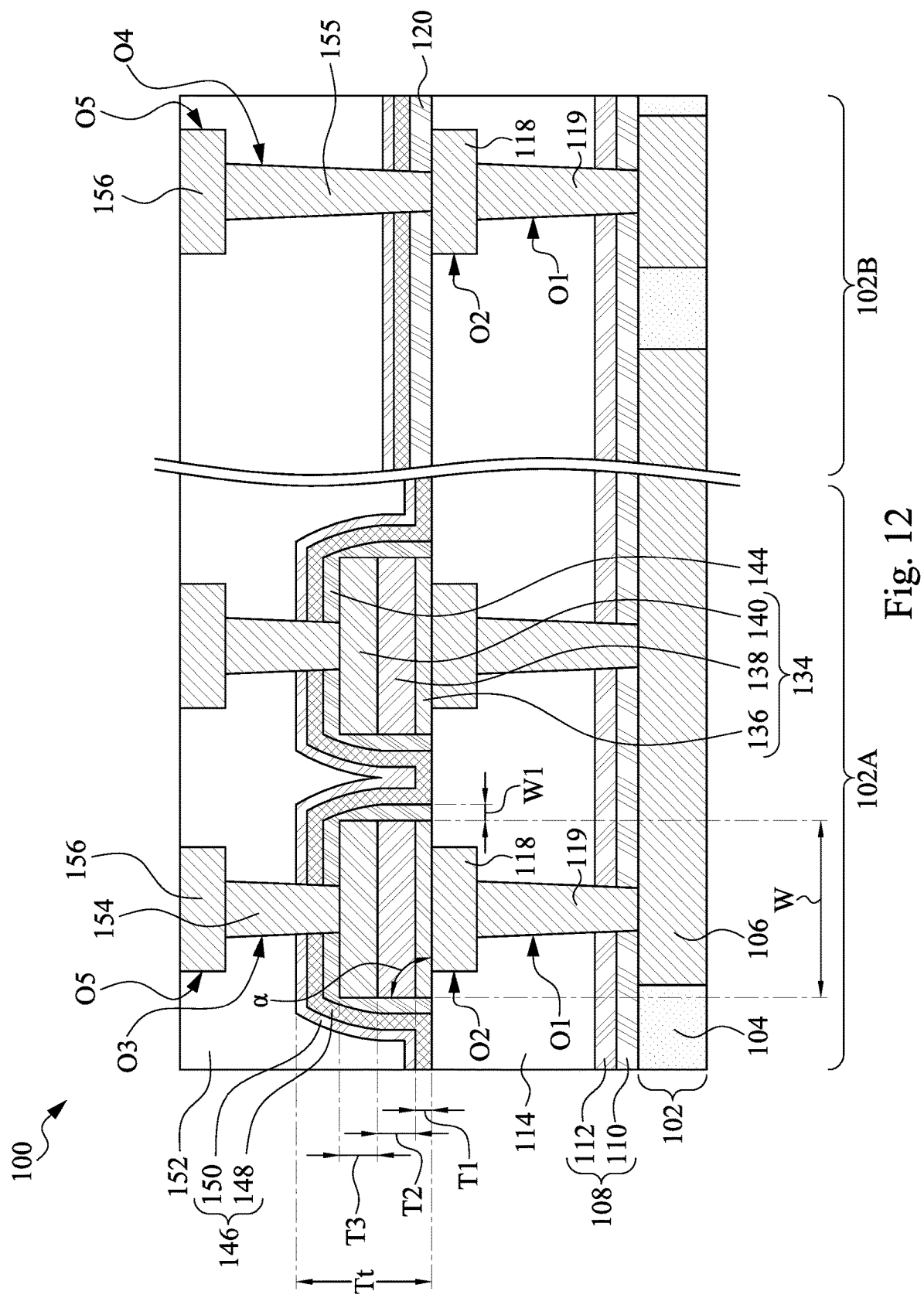

Returning to FIG. 2, the method then proceeds to operation 220 where top conductive lines and top electrode contacts embedded an upper IMD layer are formed over the upper protective liner layer. With reference to FIG. 12, in some embodiments of operation 220, an upper IMD layer 152 is deposited over the upper protective liner layer 150 over the FRAM portion 102A and the logic device portion 102B. The upper IMD layer 152 may be formed using chemical vapor deposition (CVD) such as LPCVD, PECVD, and FCVD. The top surface of the upper IMD layer 152 is planarized.

The upper IMD layer 152 is formed over the upper protective liner layer 150 and fills a gap between the neighboring FRAM structures 134. As mentioned above, the aspect ratio of a combination of the FRAM structure 134, the upper protective liner layer 150, the top etch stop layer 148, and the spacer 144 is large enough such that the gap between the neighboring FRAM structures 134 is large enough to be filled with the upper IMD layer 152. In particular, the FRAM structure 134 has opposite sidewalls that extend at the angle α in a range from about 45 degrees to about 90 degrees in order to ensure that the neighboring FRAM structures 134 laterally spaced apart to prevent shorting.

A mask layer (not shown) is formed and patterned over the upper IMD layer 152. A top electrode via opening O3 and a top trench O5 are etched in the upper IMD layer 152 over the FRAM portion 102A. For example, an etching process is performed to form the top electrode via opening O3 through the upper IMD layer 152, the upper protective liner layer 150, the top etch stop layer 148, and the spacer 144 to reach on the top electrode 140, and form the top trench O5 in the upper IMD layer 152 above the top electrode via opening O3. The mask layer can be a photoresist layer having openings corresponding to the top trench O5 and the top electrode via opening O3 to be formed. In some embodiments, the top electrode via opening O3 and top trench O5 can be formed through a dry etch process such as a plasma etching. The top electrode via opening O3 is formed to reach on the top electrode 140. A contact via opening O4 and the top trench O5 are etched in the upper IMD layer 152 over the logic device portion 102B. For example, an etching process is performed to form the contact via opening O4 through the upper IMD layer 152, the upper protective liner layer 150, the top etch stop layer 148, and the upper etch stop layer 120 to reach on the middle conductive line 118, and form the top trench O5 in the upper IMD layer 152 above the contact via opening O4. The mask layer can be a photoresist layer having openings corresponding to the top trench O5 and the contact via opening O4 to be formed. In some embodiments, the contact via opening O4 and top trench O5 can be formed through a dry etch process such as a plasma etching.

A metal material (e.g., copper, aluminum, etc) is filled in the top electrode via opening O3 and the top trench O5 over the FRAM portion 102A to form the top electrode via 154 and the top conductive line 156, respectively, by suitable processes such as plating, chemical vapor deposition (CVD), physical vapor deposition (PVD) and/or the like, and then removing the conductive material layer outside the upper IMD layer 152 by suitable processes such as CMP, etching and/or the like. A metal material (e.g., copper, aluminum, etc) is filled in the contact via opening O4 and the top trench O5 over the logic device portion 102B to form the via 155 and the top conductive line 156, respectively, by suitable processes such as plating, chemical vapor deposition (CVD), physical vapor deposition (PVD) and/or the like, and then removing the conductive material layer outside the upper IMD layer 152 by suitable processes such as CMP, etching and/or the like.

Because a depth of the top electrode via opening O3 is different from a depth of the contact via opening O4, the top electrode via opening etch and the contact via opening etch may be performed separately to ensure the control of the depths by using two photomasks-one for patterning the top electrode via opening O3 and one for patterning the contact via opening O4. In some embodiments, at least a portion of contact via opening O4 could be etched simultaneously with the etching of top electrode via opening O3, followed by masking top electrode via opening O3 and continuing with the etching of the remainder of the contact via opening O4.

Figure 13:
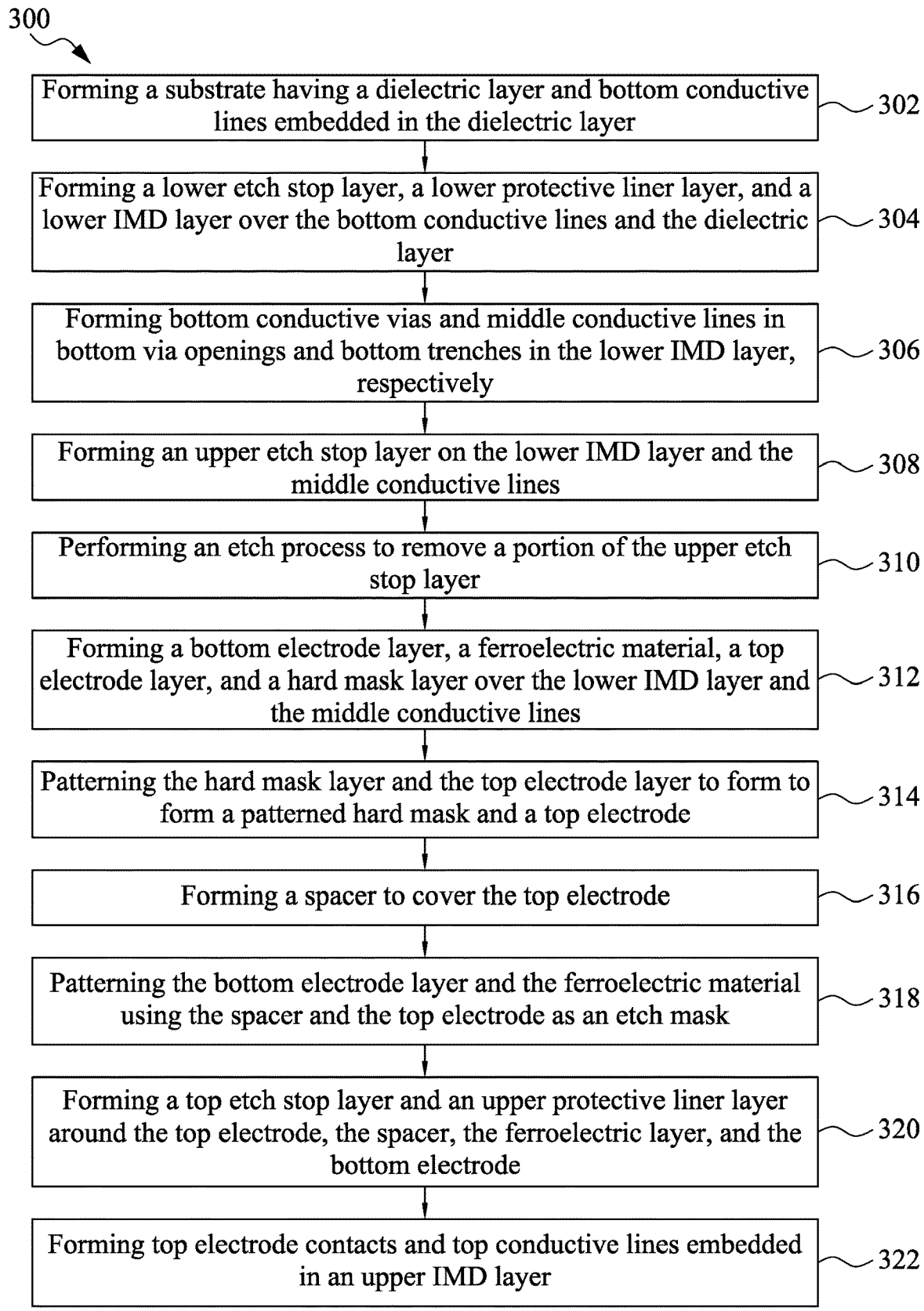
FIG. 13 is a flow chart of a method of forming a semiconductor device according to various aspects of the present disclosure.

Referring to FIG. 13, shown therein is a method 300 of forming a semiconductor device 100' according to various aspects of the present disclosure. Operations 302-312 are similar to operations 202-212 described previously and hence the descriptions thereof are not repeated herein for simplicity.

Figure 14:
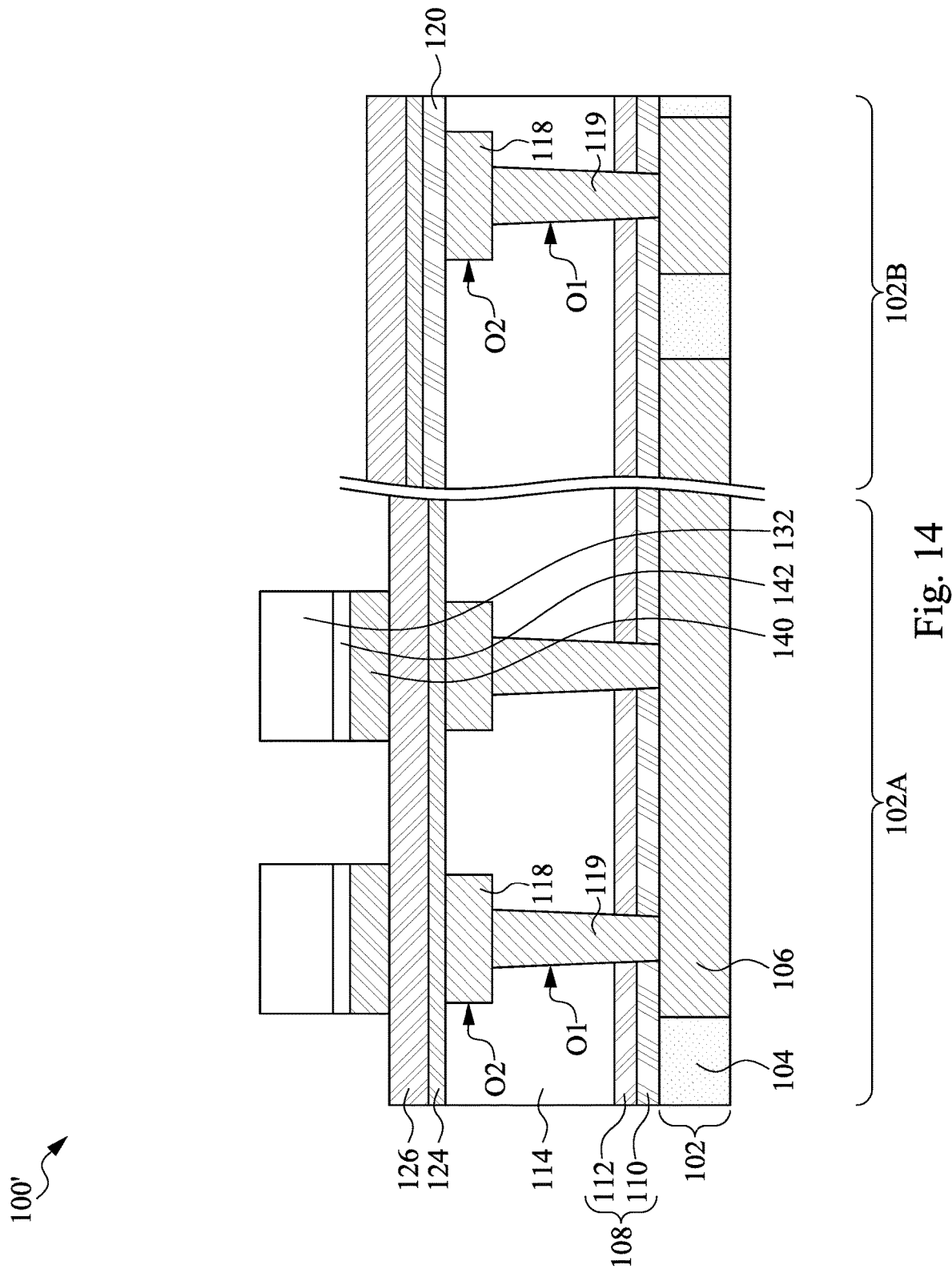
FIGS. 14-17 are cross-sectional views of a method of forming a semiconductor device at various stages in accordance with various embodiments of the present disclosure.

The method 300 is briefly described below in conjunction with FIGS. 14-17 from operation 314. In particular, FIGS. 14-17 illustrate cross-sectional views of the semiconductor device 100' during various fabrication stages. At operation 314, the hard mask layer 130 and the top electrode layer 128 (see FIG. 8) are patterned to form a patterned hard mask and a top electrode. As shown in FIG. 14, a patterned photoresist 132 is spin-on coated on the hard mask layer 130 (see FIG. 8) and defines a top electrode 140 of a FRAM structure 134 (see FIG. 15). In detail, the hard mask layer 130 and the top electrode layer 128 are patterned to form a patterned hard mask 142 and the top electrode 140. The patterning includes a photolithography operation where a photoresist (not shown) is deposited, a pattern in defined by exposing photoresist to a radiation, and developing the photoresist to create the patterned photoresist 132. The patterned photoresist 132 is then used as an etch mask to protect the desired top electrode 140 of FRAM structure 134. Portions of the hard mask layer 130 and the top electrode layer 128 are removed from the FRAM portion 102A. All of the hard mask layer 130 and the top electrode layer 128 are removed from the logic device portion 102B.

Figure 15:
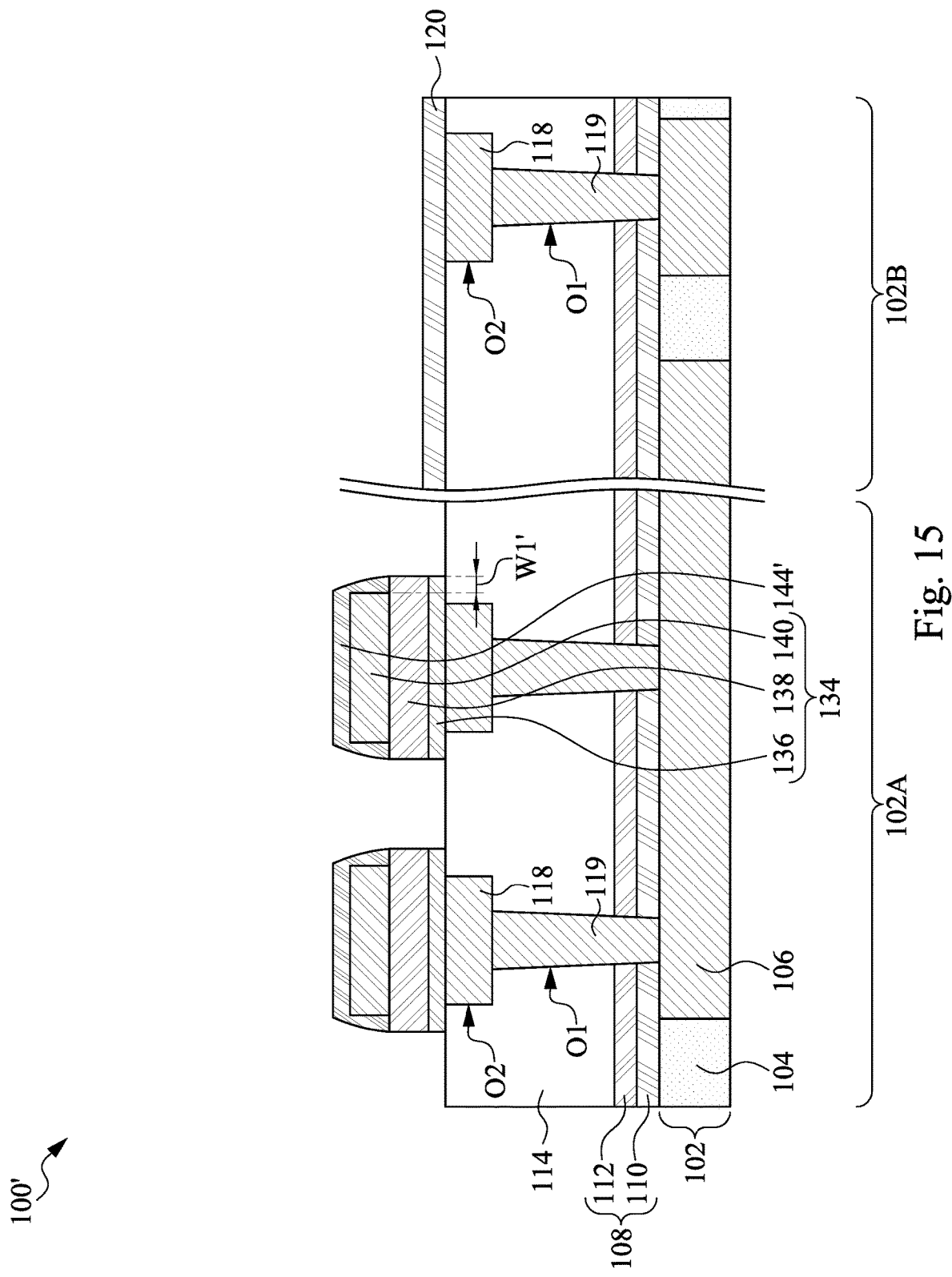

At operation 316, a spacer is formed to cover the top electrode. As shown in FIG. 15, the patterned hard mask 142 is removed and a spacer material is formed covering a top surface and sidewalls of the top electrode 140 and covering a top surface of the ferroelectric material 126. The spacer material is then anisotropically etched to form a spacer 144' extending along the top surface and sidewalls of the top electrode 140. At operation 318, the bottom electrode layer and the ferroelectric material are patterned using the spacer and the top electrode as an etch mask. The ferroelectric material 126 and the bottom electrode layer 124 are patterned using the top electrode 140 and the spacer 144' as an etch mask to form a ferroelectric layer 138 and a bottom electrode 136. The ferroelectric layer 138 and the bottom electrode 136 have a substantially same width remain over lower IMD layer 114 because of using the spacer 144' and the top electrode 140 as the etch mask. The ferroelectric material 126 and the bottom electrode layer 124 are patterned such that a width of the top electrode 140 is less than a width of the bottom electrode 136 and is less than a width of the ferroelectric layer 138. Etching the top electrode layer 128 may form undesirable etch byproducts. Since the top electrode layer 128 and the ferroelectric material 126 are patterned by separated etching processes, the etch byproducts produced by patterning the top electrode layer 128 may not be incorporated into the underlying layer (e.g., the ferroelectric material 126). In some embodiments, a width W1' of the spacer 144' is in a range from about 0.5 nm to about 50 nm.

Figure 16:
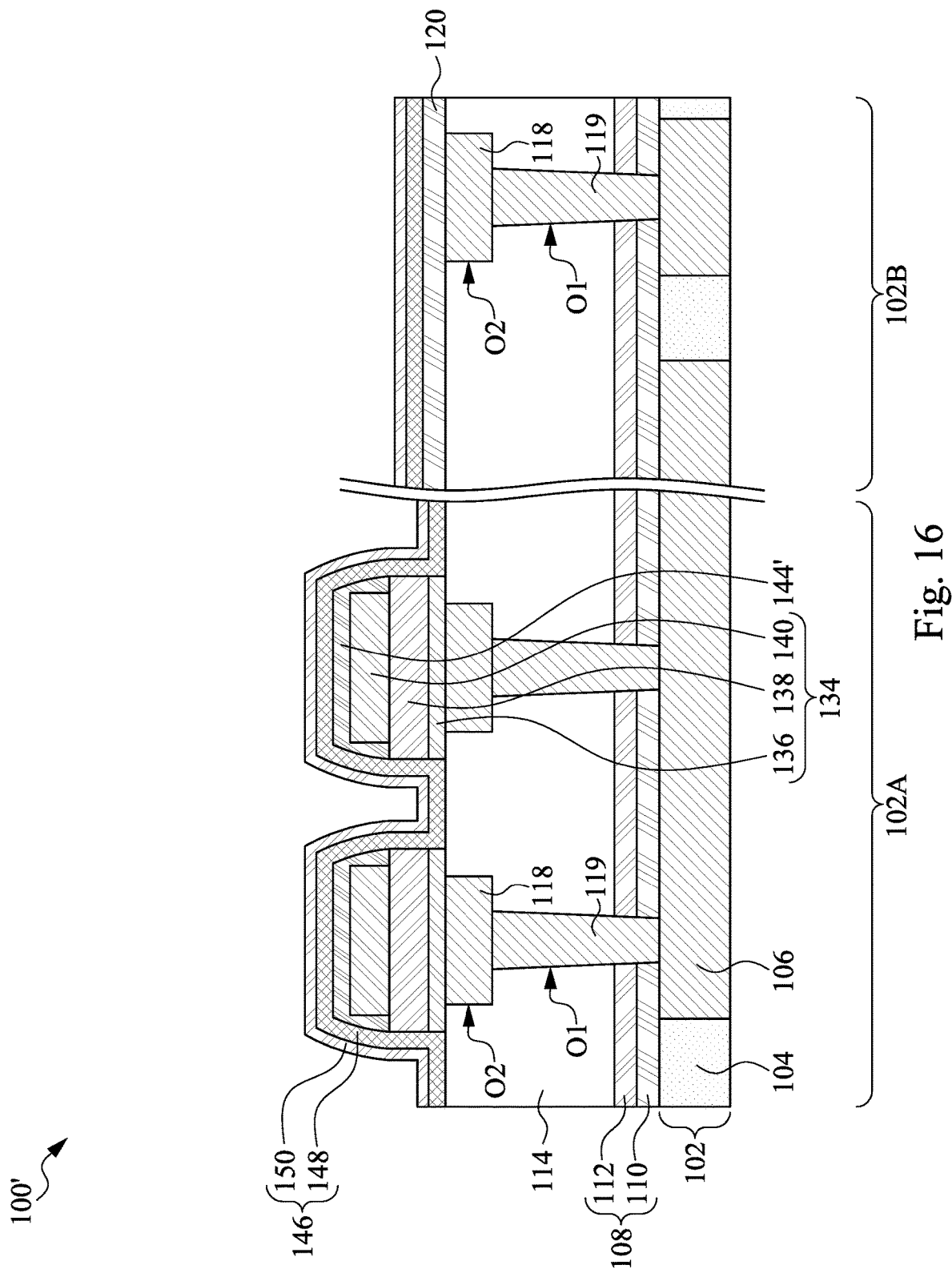

At operation 320, a top etch stop layer and an upper protective liner layer are formed around the spacer, the ferroelectric layer, and the bottom electrode. As shown in FIG. 16, a barrier layer 146 in a form of a stacking layer including a top etch stop layer 148 and an upper protective liner layer 150 is blanket deposited conformally around the spacer 144', the ferroelectric layer 138 and the bottom electrode 136. The top etch stop layer 148 is in contact with sidewalls of the ferroelectric layer 138 and sidewalls of the bottom electrode 136.

At operation 322, top electrode vias and top conductive lines embedded in an upper IMD layer are formed. As shown in FIG. 17, top electrode vias 154 are formed through the upper IMD layer 152, the upper protective liner layer 150, the top etch stop layer 148, and the spacer 144' to reach on the top electrode 140 of the FRAM structure 134 over the FRAM portion 102A. A via 155 is formed through the upper IMD layer 152, the upper protective liner layer 150, the top etch stop layer 148, and the upper etch stop layer 120 to reach on the middle conductive line 118 over the logic device portion 102B. The top conductive lines 156 are formed on the top electrode vias 154 and the via 155, respectively. In some embodiments, the top electrode vias 154, the via 155, and the top conductive lines 156 may be formed by materials suing suitable processes, as discussed previously with respect to FIG. 12.

The upper IMD layer 152 is formed over the upper protective liner layer 150 and fills a gap between the FRAM structures 134. The ferroelectric layer 138 and the bottom electrode 136 have substantially the same width. In some embodiments, a width W of the FRAM structure 134 is in a range from about 50 nm to about 150 nm. A thickness Tt' of a combination of the upper protective liner layer 150, the top etch stop layer 148, the spacer 144', and the FRAM structure 134 is in a range from about 400 nm to about 800 nm. For example, in some embodiments, a thickness T1' of the bottom electrode 136 is greater than 5 nm. In some embodiments, a thickness T2' of the ferroelectric layer 138 is greater than 2 nm. In some embodiments, a thickness T3' of the top electrode 140 is greater than 5 nm. If the thickness Tt' of a combination of the upper protective liner layer 150, the top etch stop layer 148, the spacer 144', and the FRAM structure 134, the width W of the FRAM structure 134, and the width W1' of the spacer 144' are not in the ranges as mentioned above, an aspect ratio of a combination of the FRAM structure 134, the upper protective liner layer 150, the top etch stop layer 148, and the spacer 144' may not be sufficient to allow the upper IMD layer 152 over the upper protective liner layer 150 to fill into the gap between two neighboring FRAM structures 134.

In particular, a stacked structure of the ferroelectric layer 138 and the bottom electrode 136 have opposite sidewalls that extend at an angle β in a range from about 45 degrees to about 90 degrees from the bottom surface of the bottom electrode 136 in order to ensure that the neighboring FRAM structures 134 laterally spaced apart to prevent shorting. Furthermore, the top electrode 140 has opposite sidewalls that extend at an angle γ in a range from about 45 degrees to about 90 degrees from a bottom surface of the top electrode 140 in order to ensure that the neighboring FRAM structures 134 laterally spaced apart to prevent shorting as well.

Based on the above discussion, it can be seen that the present disclosure offers advantages. It is understood, however, that other embodiments may offer additional advantages, and not all advantages are necessarily disclosed herein. Moreover, no particular advantage is required for all embodiments. One advantage is that an improved uniformity in a surface topography of the top electrode contact, the contact, and the top conductive line. Another advantage is that gap between the neighboring FRAM structures is large enough to fill the upper IMD layer. Yet another advantage is that no additional mask is required to satisfy a requirement of bottom via/electrode for the FRAM structure and thus saving cost and fabrication time.

In some embodiments, a semiconductor device includes a lower intermetal dielectric (IMD) layer, a middle conductive line, and a ferroelectric random access memory (FRAM) structure. The middle conductive line is embedded in the lower IMD layer. The FRAM structure is over the lower IMD layer and the middle conductive line. The FRAM structure includes a bottom electrode, a ferroelectric layer, and a top electrode. The bottom electrode is over the middle conductive line and in contact with the lower IMD layer. The ferroelectric layer is over the bottom electrode. The top electrode is over the ferroelectric layer.

In some embodiments, a semiconductor device includes a substrate, a lower etch stop layer, a lower intermetal dielectric (IMD) layer, a ferroelectric random access memory (FRAM) structure, and a top etch stop layer. The substrate has a FRAM portion and a logic device portion. The lower etch stop layer is over the FRAM portion and the logic device portion. The lower IMD layer is over the lower etch stop layer over the FRAM portion and the logic device portion. The FRAM structure is over the lower IMD layer over the FRAM portion. The FRAM structure includes a bottom electrode, a ferroelectric layer, and a top electrode. The bottom electrode is over the lower IMD layer. The ferroelectric layer is over the bottom electrode. The top electrode is over the ferroelectric layer. The top etch stop layer has a first portion over the FRAM structure and the lower IMD layer over the FRAM portion and a second portion over the lower IMD layer over the logic device portion. The first portion has a bottommost surface lower than a bottom surface of the second portion.

In some embodiments, a method of forming a semiconductor device includes forming a lower IMD layer and a middle conductive line embedded in the lower IMD layer over a substrate that has a FRAM portion and a logic device portion; forming an upper etch stop layer over the lower IMD layer and the middle conductive line over the FRAM portion and the logic device portion; removing the upper etch stop layer over the FRAM portion to expose a portion of the middle conductive line and a portion of the lower IMD layer; and forming a FRAM structure over the portion of the middle conductive line and the portion of the lower IMD layer, in which the FRAM structure includes a bottom electrode in contact with the lower IMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a ferroelectric random access memory (FRAM) portion and a logic device portion;
   a lower intermetal dielectric (IMD) layer on the substrate;
   a middle conductive line embedded in the lower IMD layer;
   a ferroelectric random access memory (FRAM) structure over the lower IMD layer and the middle conductive line, the FRAM structure comprising:
      a bottom electrode over the middle conductive line and in contact with the lower IMD layer;
      a ferroelectric layer over the bottom electrode; and
      a top electrode over the ferroelectric layer;
   a spacer extending along a sidewall of the top electrode and terminating at a top surface of the ferroelectric layer, wherein the spacer has a bottom surface in contact with the top surface of the ferroelectric layer; and
   a top etch stop layer having a first portion over the FRAM structure and the lower IMD layer and a second portion over the lower IMD layer over the logic device portion, wherein the first portion has a bottommost surface not aligned with a bottommost surface of the second portion.

2. The semiconductor device of claim 1, wherein the bottom electrode of the FRAM structure has a flat bottom surface in contact with the middle conductive line and the lower IMD layer.

3. The semiconductor device of claim 1, wherein an interface between the bottom electrode of the FRAM structure and the lower IMD layer is coplanar with an interface between the bottom electrode of the FRAM structure and the middle conductive line.

4. The semiconductor device of claim 1, wherein a material of the bottom electrode of the FRAM structure is different from or the same as a material of the middle conductive line.

5. The semiconductor device of claim 1, further comprising:
   a bottom conductive via embedded in the lower IMD layer and under the middle conductive line; and
   a bottom conductive line under the lower IMD layer, wherein the FRAM structure is electrically connected to the bottom conductive line through the bottom conductive via and the middle conductive line.

6. The semiconductor device of claim 1,
   wherein an interface between the top etch stop layer and the lower IMD layer is coplanar with a top surface of the middle conductive line.

7. The semiconductor device of claim 6, wherein a material of the lower IMD layer is different from a material of the top etch stop layer.

8. The semiconductor device of claim 6, wherein the top etch stop layer is in contact with a sidewall of the ferroelectric layer and a sidewall of the bottom electrode.

9. The semiconductor device of claim 1, wherein the ferroelectric layer has a top width greater than a bottom width of the top electrode.

10. A semiconductor device, comprising:
    a substrate having a ferroelectric random access memory (FRAM) portion and a logic device portion;
    a lower etch stop layer over the FRAM portion and the logic device portion;

a lower intermetal dielectric (IMD) layer over the lower etch stop layer over the FRAM portion and the logic device portion;

a FRAM structure over the lower IMD layer over the FRAM portion, and the FRAM structure comprising:

a bottom electrode over the lower IMD layer;

a ferroelectric layer over the bottom electrode; and a top electrode over the ferroelectric layer; and a top etch stop layer having a first portion over the FRAM structure and the lower IMD layer over the FRAM portion and a second portion over the lower IMD layer over the logic device portion, wherein the first portion has a bottommost surface lower than a bottom surface of the second portion.

11. The semiconductor device of claim 10, wherein a width of the top electrode is less than a width of the bottom electrode.

12. The semiconductor device of claim 10, further comprising:

an upper etch stop layer between the second portion of the top etch stop layer and the lower IMD layer over the logic device portion, wherein the upper etch stop layer has a bottom surface substantially coplanar with the bottommost surface of the first portion of the top etch stop layer over the FRAM portion.

13. The semiconductor device of claim 12, wherein the FRAM portion is free from coverage by the upper etch stop layer.

14. The semiconductor device of claim 10, further comprising:

an upper protective liner layer over the first portion of the top etch stop layer over the FRAM portion and over the second portion of the top etch stop layer over the logic device portion, wherein the upper protective liner layer over the logic device portion has a bottom surface higher than a bottommost surface of the upper protective liner layer over the FRAM portion.

15. The semiconductor device of claim 10, wherein the top etch stop layer is in contact with sidewalls of the ferroelectric layer and sidewalls of the bottom electrode.

16. The semiconductor device of claim 10, further comprising:

a middle conductive line embedded in the lower IMD layer, wherein the middle conductive line includes a material different from a material of the bottom electrode of the FRAM structure.

17. A semiconductor device, comprising:

a lower intermetal dielectric (IMD) layer;

a middle conductive line embedded in the lower IMD layer;

a ferroelectric random access memory (FRAM) structure over the lower IMD layer and the middle conductive line, the FRAM structure comprising:

a bottom electrode over the middle conductive line, wherein the bottom electrode has a bottom surface having a width along a first direction greater than a width of the middle conductive line along the first direction;

a ferroelectric layer over the bottom electrode; and a top electrode over the ferroelectric layer;

a spacer extending from a top surface of the lower IMD layer to cover a sidewall and a top of the FRAM structure, wherein the spacer is in contact with the lower IMD layer, an interface between the spacer and the lower IMD layer is at a position lower than a position of an interface between the ferroelectric layer and the bottom electrode; and a top etch stop layer over the lower IMD layer and the FRAM structure, wherein an interface between the top etch stop layer and the lower IMD layer is coplanar with a top surface of the middle conductive line, and the interface between the spacer and the lower IMD layer is coplanar with the interface between the top etch stop layer and the lower IMD layer.

18. The semiconductor device of claim 17, wherein the FRAM structure has opposite sidewalls extending at an angle in a range from 45 degrees to 90 degrees from the bottom surface of the bottom electrode.

19. The semiconductor device of claim 17, wherein the spacer has a portion laterally between the top etch stop layer and the bottom electrode.

20. The semiconductor device of claim 19, wherein the spacer has another portion laterally between the top etch stop layer and the ferroelectric layer.

* * * * *